(12) United States Patent
Hoogzaad et al.

(10) Patent No.: US 11,424,721 B2
(45) Date of Patent: Aug. 23, 2022

(54) RF AMPLIFIER

(71) Applicant: NXP B.V., San Jose, CA (US)

(72) Inventors: Gian Hoogzaad, Mook (NL);
Guillaume Lebailly, Maizieres (FR);
Klaas-Jan de Langen, Bergschenhoek (NL)

(73) Assignee: NXP B.V., Eindhoven (NL)

( * ) Notice: Subject to any disclaimer, the term of this patent is extended or adjusted under 35 U.S.C. 154(b) by 42 days.

(21) Appl. No.: 17/069,416

(22) Filed: Oct. 13, 2020

(65) Prior Publication Data
US 2021/0159856 A1 May 27, 2021

(30) Foreign Application Priority Data
Nov. 21, 2019 (EP) .................... 19306504

(51) Int. Cl.
*H03F 1/22* (2006.01)
*H03F 3/195* (2006.01)

(52) U.S. Cl.
CPC .............. *H03F 1/22* (2013.01); *H03F 3/195* (2013.01); *H03F 2200/451* (2013.01); *H03F 2200/84* (2013.01)

(58) Field of Classification Search
CPC ........................................ H03F 1/22
USPC ................................. 330/310, 311
See application file for complete search history.

(56) References Cited

U.S. PATENT DOCUMENTS

| 7,023,281 B1* | 4/2006 | Ali ........................... H03F 1/22 330/285 |
| 7,397,309 B2* | 7/2008 | Tanoi ...................... H03F 1/223 330/296 |
| 2005/0168288 A1* | 8/2005 | Li ........................... H03F 1/223 330/298 |
| 2009/0051435 A1 | 2/2009 | Griffiths et al. |
| 2018/0069508 A1 | 3/2018 | Seshita et al. |
| 2019/0173432 A1 | 6/2019 | Van Der Heijden et al. |
| 2019/0296692 A1 | 9/2019 | Patel et al. |

OTHER PUBLICATIONS

Moreira, C.P., "A Reconfigurable DCS1800/W-CDMA LNA: Design and Implementation Issues", Proceedings of the 36th European Microwave Conference, Sep. 2006.
Nakatani, T., "A Wide Dynamic Range Switched-LNA in SiGe BiCMOS", 2001 IEEE Radio Frequency Integrated Circuits Symposium, May 2001.

* cited by examiner

*Primary Examiner* — Henry Choe

(57) ABSTRACT

An RF amplifier for implementation in SiGe HBT technology is described. The RF amplifier has a cascode stage comprising a common base (CB) transistor and a common emitter (CE) transistor arranged in series between a first voltage rail and a second voltage rail. An RF input is coupled to the base of the CE transistor and an RF output is coupled to the collector of the CB transistor. The RF amplifier includes a CB power-down circuit arranged between the base of the CB transistor and the second voltage rail and a CE power-down circuit arranged between the base of the CE transistor and the second voltage rail. In a power-down mode the CE power-down circuit couples the base of the common-emitter-transistor to the second voltage rail. The CB power-down mode circuit couples the base of the CB transistor to the second voltage rail via a high-ohmic path.

20 Claims, 6 Drawing Sheets

RF AMPLIFIER

CROSS-REFERENCE TO RELATED APPLICATIONS

This application claims the priority under 35 U.S.C. § 119 of European Patent application no. 19306504.2, filed on 21 Nov. 2019, the contents of which are incorporated by reference herein.

FIELD

This disclosure relates to a radio-frequency (RF) amplifier for implementation in Silicon-Germanium (SiGe) heterojunction-bipolar transistor (HBT) technology.

BACKGROUND

RF amplifiers used for example in 5G multi-channel products for antenna arrays may be implemented in Si—Ge HBT technology. Adding Germanium to the base of a bipolar transistor, may boost the RF performance by reducing the band-gap. The RF amplifier may also be required to have a stand-by leakage current below a certain level for battery powered products.

In non-battery-powered applications of RF amplifiers, for example in cellular base-stations, leakage current measurements made during production test may also detect devices which have relatively weak capacitors, oxides and MOS-FETs. Devices having a high leakage current and/or other faults may then be screened out.

SUMMARY

Various aspects of the disclosure are defined in the accompanying claims. In a first aspect there is provided an RF amplifier for implementation in SiGe HBT technology, the RF amplifier comprising: a cascode stage comprising a common-base-cascode-transistor and a common-emitter-transistor arranged in series between a first voltage rail and a second voltage rail; an RF input coupled to the base of the common-emitter-transistor; an RF output coupled to the collector of the common-base-cascode-transistor; a common-base bias circuit coupled to the base of the common-base-cascode-transistor and comprising a common-base-power-down circuit arranged between the base of the common-base-cascode-transistor and the second voltage rail; a common-emitter bias circuit coupled to the base of the common-emitter-transistor comprising a common-emitter-power-down circuit arranged between the base of the common-emitter-transistor and the second voltage rail; and wherein in a power-down mode of operation, the common-emitter power-down circuit is configured to couple the base of the common-emitter-transistor to the second voltage rail and the common-base-power-down circuit is configured to couple the base of the common-base transistor to the second voltage rail via a high-ohmic path.

In one or more embodiments, in the power-down mode, the base-emitter junction of the common-base-cascode-transistor is not reverse-biased.

In one or more embodiments, the first voltage rail may be a voltage supply rail and the second voltage rail is a ground rail.

In one or more embodiments, the impedance of the high-ohmic path may be greater than 100 KOhm.

In one or more embodiments, the common-base power-down circuit may comprise a current mirror wherein a first transistor of the current mirror is coupled to a reference current source and the second transistor of the current mirror is arranged between the base of the common-base-cascode-transistor and the second supply terminal and wherein the current mirror is configured to limit the current between the base of the common-base-cascode-transistor and the second supply terminal in the power down mode.

In one or more embodiments, the current limit may be determined by the relative width to length ratios of the first MOS transistor channel and the second MOS transistor channel.

In one or more embodiments, the RF amplifier may further comprise a second cascode stage having a second common-emitter-transistor and second common-base-cascode-transistor wherein the current mirror further comprises a third transistor arranged between the base of the second common-base-cascode-transistor and the second supply terminal. The current mirror may be further configured to limit the current between the base of the second common-base-cascode-transistor and the second supply terminal in the power down mode.

In one or more embodiments, the common-base bias circuit may further comprise a common-base-test-mode control transistor coupled between the base of the common-base-cascode-transistor and the second supply rail and wherein in a common-base-test-mode, the common-base bias circuit is further configured to couple the base of the common-base-cascode-transistor to the second supply rail via a low-ohmic path, and the common-emitter-power-down circuit is further configured to couple the base of the common-emitter-transistor to the second supply rail via a low-ohmic path.

In one or more embodiments, the common-base bias circuit may further comprise a common-emitter-test mode control transistor coupled between the base of the common-base-cascode-transistor and the first supply rail; and wherein in a common-emitter-test-mode the common-base bias circuit is further configured to couple the base of the common-base-cascode-transistor to the first supply rail via a low-ohmic path, and the common-emitter-power-down circuit is further configured to couple the base of the common-emitter-transistor to the second supply rail via a low-ohmic path.

In one or more embodiments, the RF amplifier may further comprise an emitter isolation switch arranged between the emitter of the common-emitter-transistor and the second supply terminal and having a control input configured to receive a power down control signal, wherein in the power down mode of operation, the emitter isolation switch is configured to decouple the emitter of the common-emitter-transistor from the second supply rail.

In one or more embodiments, in the power down mode, the common-emitter power down circuit may be configured to couple the base of the common-emitter transistor to the second supply rail via a high-ohmic path.

In one or more embodiments, in the power-down mode of operation, the common-emitter power-down circuit may be configured to couple the base of the common-emitter-transistor to the second voltage rail via a low-ohmic path wherein the low-ohmic path impedance is less than the high-ohmic path impedance.

The impedance of the low-ohmic path may be less than 2 KOhm.

Embodiments of the RF amplifier may be included in a mobile device or a mobile cellular base station.

In one or more embodiments, in the power-down mode of operation, the voltage level at the base of the common-basecascode-transistor may increase to within 5% of the voltage of the first supply rail in response to a manufacturing defect being present. The voltage level at the base of the common-base-cascode-transistor may be within 5% of the voltage of the second supply rail if a manufacturing defect is not present.

In one or more embodiments, the high-ohmic path impedance may be greater than 1 MΩ.

In a second aspect there is provided, an RF amplifier for implementation in SiGe HBT technology, the RF amplifier comprising: a common-base-cascode-transistor and a common-emitter-transistor arranged in series between a supply node and a ground node; an RF input coupled to the base of the common-emitter-transistor; an RF output coupled to the collector of the common-base-cascode-transistor; a common-base-power-down circuit arranged between the base of the common-base-cascode-transistor and the ground node; a common-emitter-power-down circuit arranged between the base of the common-emitter-transistor and the ground node; and wherein in a power-down mode of operation, the common-emitter power-down circuit is configured to couple the base of the common-emitter-transistor to the ground node and the common-base-power-down circuit is configured to couple the base of the common-base transistor to the ground node via a high-ohmic path.

In one or more embodiments, the high-ohmic path may have an effective impedance value of greater than 100 KOhm.

BRIEF DESCRIPTION OF THE DRAWINGS

In the figures and description like reference numerals refer to like features. Embodiments of are now described in detail, by way of example only, illustrated by the accompanying drawings in which.

DETAILED DESCRIPTION

Figure 1:
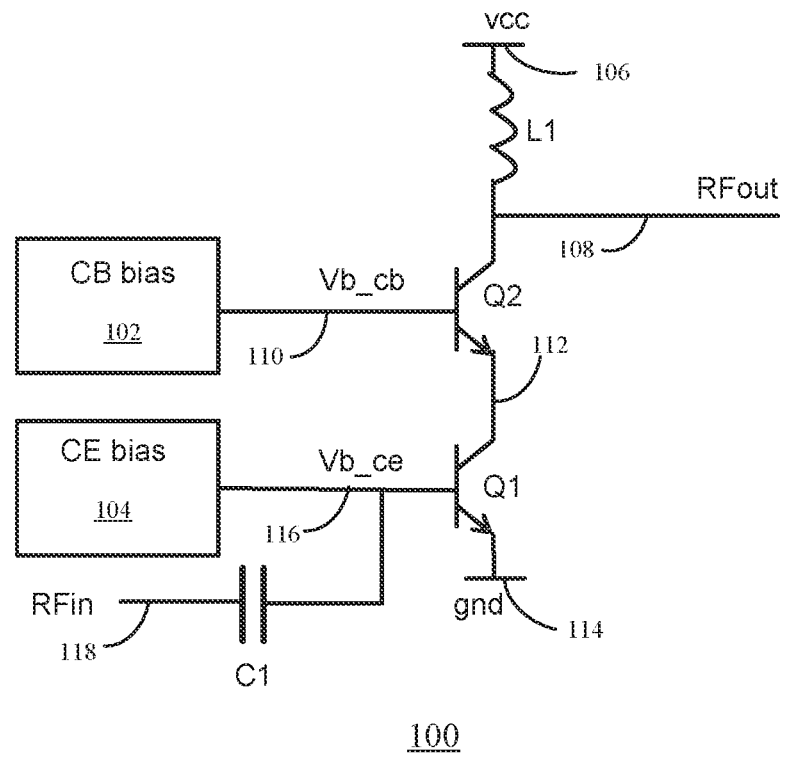
FIG. 1 Shows a typical RF amplifier.

FIG. 1 shows a typical RF amplifier 100. The RF amplifier 100 may have an RF input 118 and an RF output 108. The RF amplifier 100 has a cascode stage including a common-base bias circuit 102, and a common emitter bias circuit 104. The RF amplifier 100 has a common emitter (CE) transistor Q1 which is typically an NPN HBT having an emitter connected to a second supply rail or node 114 which is typically at a ground potential. Node 112 may be connected to the collector of the common emitter transistor Q1 and an emitter of a common base (CB) cascode transistor Q2 which is typically an NPN HBT. The collector of the common-base-cascode-transistor Q2 may be connected to the RF output 108. The collector of the common-base-cascode-transistor Q2 may be connected to a first terminal of an inductor or coil L1. A second terminal of the inductor or coil L1 may be connected to a first supply rail or node 106 which in operation may be at a supply voltage VCC which may for example be in the range of 2.5 to 3 volts.

The RF input 118 may be connected to a first terminal of a AC coupling capacitance C1. The second terminal of the AC coupling capacitor C1 may be connected to the common emitter bias circuit output 116. The common emitter bias circuit output 116 is connected to the base of the common emitter transistor QL. The common base bias circuit output 110 is connected to the base of the common-base-cascode-transistor Q2.

In normal operation mode or amplification mode of the RF amplifier 100, the common-emitter-transistor Q1 is typically biased at the base by the common emitter bias circuit 104 such that it carries some desired current and has a bias voltage Vb_ce. The common-base-cascode-transistor Q2 is typically biased with a desired voltage Vb_cb at the base by the common base bias circuit 102 such that the common-emitter-transistor Q1 does not saturate and the RF output voltage swing at the collector of the common-base-cascode-transistor Q2 is maximized. An RF signal on RF input 118 is typically fed to the base of the common-emitter-transistor Q1 via the AC coupling capacitor C1.

Figure 2:
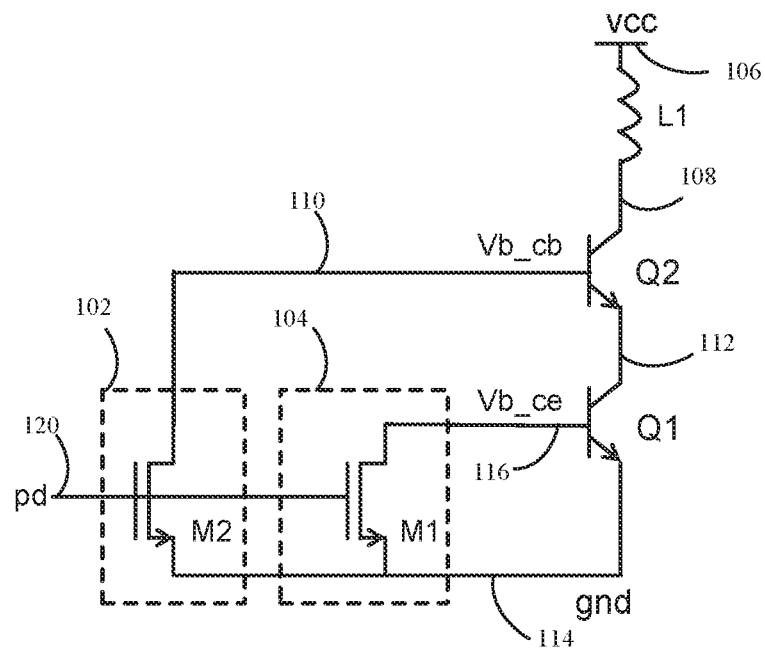
FIG. 2 illustrates part of the common base bias circuit and common emitter bias circuit used in a power-down mode of operation of the RF amplifier of FIG. 1.

This RF power amplifier 100 typically has a power-down mode for those cases where the amplification functionality is not needed. FIG. 2 illustrates part of the common base bias circuit 102 and common emitter bias circuit 104 used in a power-down mode of operation of the RF amplifier 100. While in normal operation the CE bias output 116 and the CB bias output 110 are driven by the normal operation CE bias circuitry (not shown) and the normal operation CB bias circuit (not shown) and are low-ohmic. These normal operation bias circuits will become high-ohmic when used in power-down mode. To prevent floating nodes and associated undefined voltages, the CE bias circuit 104 includes a CE power down NMOS transistor M1 having a drain connected to the common emitter bias circuit output 116, a source connected to the second supply rail 114 and a gate terminal connected to a power-down mode control 120. The CB bias circuit 102 includes a CB power down NMOS transistor M2 having a drain connected to the common base bias circuit output 110, a source connected to the second supply rail 114 and a gate connected to a power-down mode control 120.

During a power-down mode, the power-down mode control 120 is asserted and the CE power down NMOS transistor M1 and the CB power down NMOS transistor M2 are switched on coupling the bases of the common-emitter-transistor Q1 and the common-base-cascode-transistors to ground. The transistors M1 and M2 provide a low-ohmic path to the second supply rail 114 which may have an impedance in the range of a few 100Ω-1 kΩ in order to have a robust power-down state. The second supply rail 114 is typically aground and the respective base voltage levels Vb_ce for common-emitter-transistor Q1 and Vb_cb for CB transistor Q2 the base of the common-emitter-transistor are held at the voltage level close to the voltage of the second supply rail 114.

Figure 3:
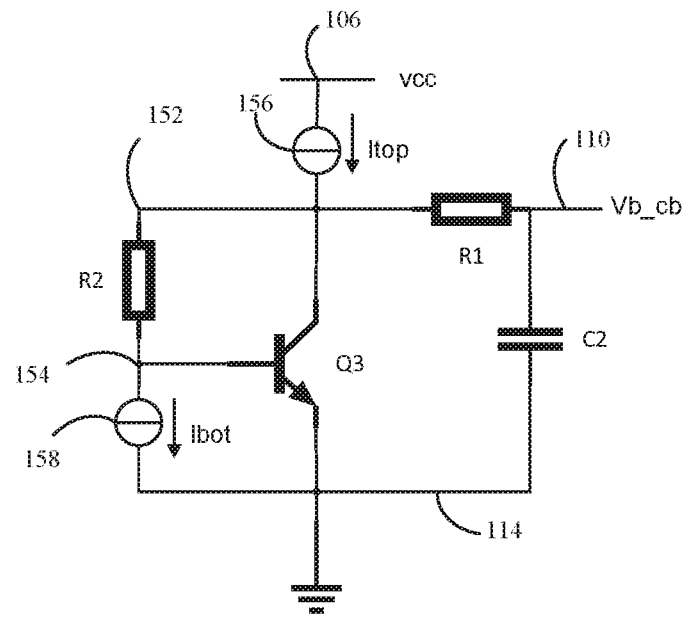
FIG. 3 Shows an example common base bias circuit used in a normal operation mode of the RF amplifier of FIG. 1.

FIG. 3 shows typical common-base bias circuitry 150 which may be included in common-emitter bias circuit 102 to bias common-base-cascode-transistor Q2 in normal operation mode. Node 152 is connected to a first terminal of resistor R1. Node 152 is connected to a collector of bias transistor Q3. Node 152 is connected to a first terminal of resistor R2. Node 152 is connected to a first terminal of a bias current source 156. The second terminal of the bias current source 156 is connected to the first supply rail 106. Node 154 is connected to a second terminal of the second resistor R2. Node 154 is connected to a first terminal of a second current source 158. Node 154 is connected to a base of bias transistor Q3. The second supply rail 114 is connected to a second terminal of the second current source 158. The second supply rail 114 is connected to the emitter of bias transistor Q3. The second supply rail 114 is connected to a first terminal of a capacitor C2. The common base bias circuit output 110 is connected to a second terminal of first resistor R1. The common base bias circuit output 110 is connected to a second terminal of the decoupling capacitor C2.

In normal operation of the RF amplifier 100, the decoupling capacitor C2 provides the RF base current for the common-base-cascode-transistor Q2. Resistor R1 provides isolation towards the bias circuit 150, but does not significantly modify the voltage bias level Vb_cb. Current sources, 156,158 provide currents Itop and Ibot respectively where the difference between the currents Itop-Ibot will flow through Q3. The base emitter voltage Vbe of Q3 is added to the voltage Ibot·R2 to provide the bias voltage Vb_cb. The voltage value of Ibot·R2 is determined to provide the common-emitter-transistor with sufficient collector voltage to prevent saturation.

Figure 4:
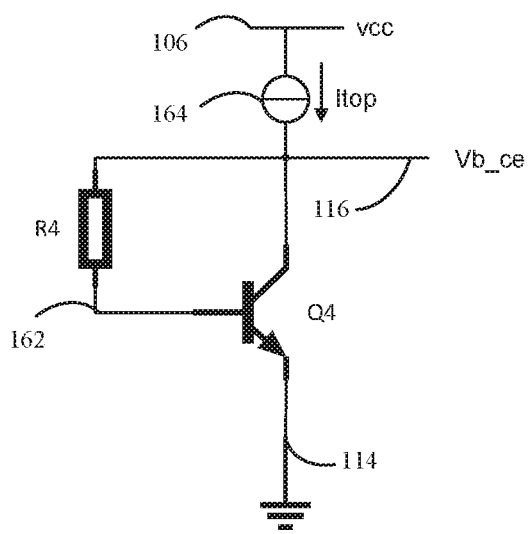
FIG. 4 Shows an example common emitter bias circuit used in a normal operation mode of the RF amplifier of FIG. 1.

FIG. 4 shows typical common-emitter bias circuitry 160 which may be included in common-emitter bias circuit 104 to bias common-emitter-transistor Q1 in normal operation mode. Node 162 is connected to the base of bias transistor Q4 which as illustrated is an NPN transistor. Node 162 is connected to a first terminal of a feedback resistor R4. The emitter of the bias transistor Q4 is connected to second supply rail 114. The common-emitter bias circuit output 116 is connected to a second terminal of the feedback resistor R4. The common-emitter bias circuit output 116 is connected to a first terminal of a current source 164. The common-emitter bias circuit output 116 is connected to the collector of the bias transistor Q4. The first supply rail 106 is connected to a first terminal of the current source 164. The combination of the feedback resistor R4 and the bias transistor Q4 may result in a relatively low-ohmic impedance corresponding to 1/gm of bias transistor Q4 at DC and low frequencies, while having a relatively high-ohmic impedance corresponding to the value of feedback resistance R4 at the RF operating frequencies. This may avoid diverting the carrier input power at RF frequencies into the bias circuit 160, and shorting the modulation bandwidth frequencies for optimal linearity.

Figure 5:
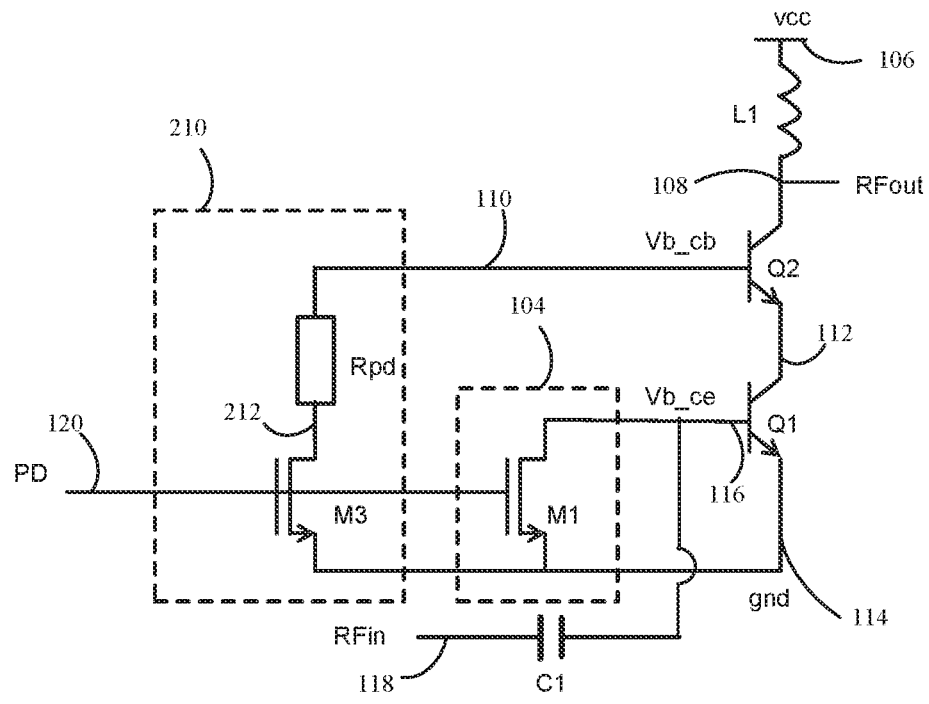
FIG. 5 illustrates a RF amplifier according to an embodiment.

FIG. 5 shows a RF amplifier 200 according to an embodiment. The RF amplifier 200 may have an RF input 118 and an RF output 108 and a cascode stage of common emitter transistor Q1 and common-base-cascode-transistor Q2. The RF input 118 may be connected via AC coupling capacitor C1 to the base of common emitter transistor Q1. The RF amplifier 100 has a common-base bias circuit 210, and a common emitter bias circuit 104. The RF amplifier 100 has a common emitter (CE) transistor Q1 which is typically an NPN HBT having an emitter connected to a second supply rail 114 which is typically at a ground. Node 112 may be connected to the collector of the common emitter transistor Q1 and an emitter of a common base (CB) cascode transistor Q2 which is typically an NPN HBT. The collector of the common-base-cascode-transistor Q2 may be connected to the RF output 108. The collector of the common-base-cascode-transistor Q2 may be connected to a first terminal of an inductor or L1. A second terminal of the inductor or coil L1 may be connected to a first supply rail 106 which may be at a supply voltage VCC.

The CE bias circuit 104 includes a CE power down NMOS transistor M1 having a first terminal connected to the common emitter bias circuit output 116, a second terminal connected to the second supply rail 114 and a gate terminal connected to a power-down mode control 120. The CB bias circuit 210 includes a CB power down NMOS transistor M3 having a first terminal connected to node 212, a second terminal connected to the second supply rail 114 and a gate terminal connected to a power-down mode control 120. Node 212 may be connected to a first terminal of pull-down resistor Rpd. A second terminal of pull-down resistor Rpd may be connected to the common base bias circuit output 110. The bias circuitry for CE bias circuit 104 and CB bias circuit 210 is not shown.

Normal operation is similar to that previously described for RF amplifier 100. During a power-down mode, the power-down mode control 120 is asserted and the CE power down NMOS transistor M1 and the CB power down NMOS transistor M3 are switched on coupling the bases of the common-emitter-transistor Q1 and the common-base-cascode-transistor Q2 to the second supply rail 114. The transistor M1 provides a low-ohmic path to the second supply rail 114 which may have an impedance in the range of a few 100Ω-1 kΩ in order to have a robust power-down state. The resistor Rpd may have a much higher impedance value than the impedance of the low-ohmic path. The impedance value of Rpd may be for example above 100 KΩ. The resistor Rpd and transistor M3 provide a high-ohmic path to the second supply rail 114. The terms high-ohmic path and low-ohmic path as used in the present disclosure refer to the effective impedance between two nodes for example the base of a transistor and the second supply rail. This effective impedance may be implemented by active or passive circuitry.

The inventors of the present disclosure have appreciated that by providing a high-impedance path from the base of the common-base-cascode-transistor Q2 to the second supply voltage rail 114 in a power-down mode, the production yield of the RF amplifier 200 may be improved.

Figure 6:
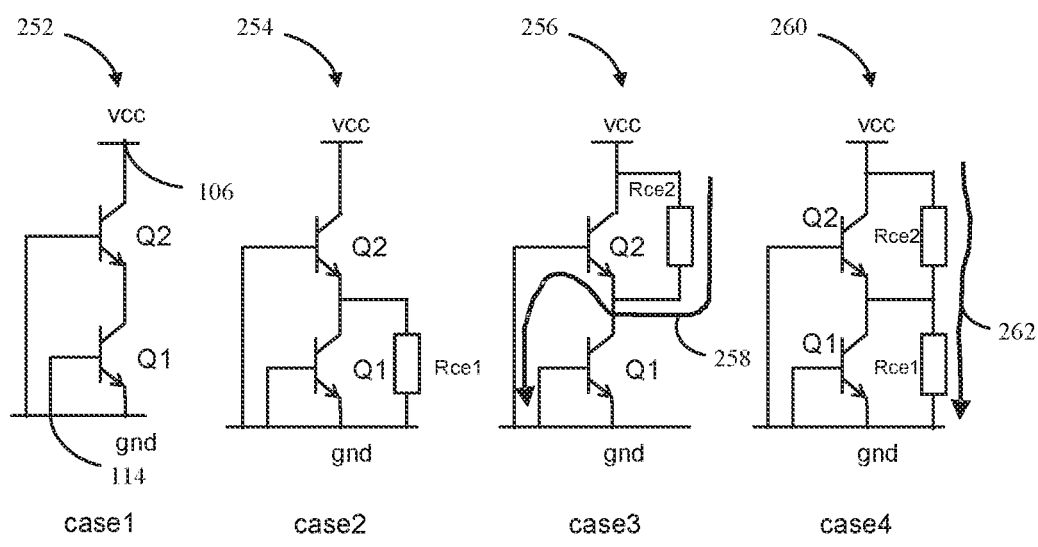
FIG. 6 shows example leakage current paths due to stacking faults.

This may be understood further by reference to FIG. 6 which shows the effect of so-called stacking faults. Stacking-faults may occur in SiGe HBTs and also any other technology using an epitaxial device having two (or more) materials with a different crystal lattice constant.

These stacking faults are lattice defects which create conducting pipes from collector through the base to the emitter. These defects are electrically modelled as resistors from collector to emitter Rce. Like other defects, the technology is characterized by a certain defect density and a certain distribution of the severity of the effect, i.e. a distribution of this Rce. These defects may affect product yield in two ways. First, if the leakage current itself is a requirement from the system or application, a higher leakage current than required will result in the device being rejected. Second, stacking faults in HBT's create high leakage levels typically >1 uA which cannot be distinguished from capacitor/oxide/MOSFET leakage. Consequently, leakage current due to stacking faults will negatively impact product yield.

Referring to FIG. 6, and the table below, the equivalent circuits of the cascode stage 250 for four cases can be distinguished for stacking faults in the RF transistors in power-down mode for RF amplifier 100. Case 1 is shown by equivalent circuit 252, case 2 is shown by equivalent circuit 254, case 3 is shown by equivalent circuit 256, case 4 is shown by equivalent circuit 260. In each of the four cases, the base of the common emitter transistor Q1 and the common-base-cascode-transistor Q2 are connected to the second supply rail 114 by a low-ohmic path and so are shown as a direct connection. The coil L1 is also omitted from the equivalent circuits 250 since the DC resistance of coil L1 is negligible and consequently in power-down mode, there is a low-ohmic path between the first supply rail 106 and the collector of common-base-cascode-transistor Q2.

Case 1 shows the equivalent circuit 252 with no stacking faults.

Case 2 is shown by equivalent circuit 254 having a resistor Rce1 connected between the collector of common emitter transistor Q1 and the second supply rail 114, corresponding to a stacking fault in common emitter transistor Q1.

Case 3 is shown by equivalent circuit 256 having a resistor Rce2 connected between the collector of common-base-cascode-transistor Q2 and the first supply rail 106, corresponding to a stacking fault in common-base-cascode-transistor Q2.

Case 4 is shown by equivalent circuit 260 having a resistor Rce1 connected between the collector of common emitter transistor Q1 and the second supply rail 114 and a resistor Rce2 connected between the collector of common-base-cascode-transistor Q2 and the first supply rail 106. Case 4 corresponds to a stacking fault in both common emitter transistor Q1 and common-base-cascode-transistor Q2. Table 1 below shows a summary of the fault conditions for each case.

TABLE 1

| Case number | common-emitter-transistor Q1 | common-base-cascode-transistor Q2 |
|---|---|---|
| 1 | no stacking fault | no stacking fault |
| 2 | stacking fault | no stacking fault |
| 3 | no stacking fault | stacking fault |
| 4 | stacking fault | stacking fault |

Assuming that the first supply rail 106 is at a supply voltage Vcc and the second supply rail 114 is a ground, case 1 is not of interest because it shows the fault-free case.

Case 2 does not result in increased leakage current due to a stacking fault when the pull-down of the CB transistor Q2 is connected to ground because CB transistor Q2 will be off resulting in zero voltage across Rce1 resulting in zero current.

For case 3 there is a leakage path 258 through a reverse-biased base-emitter junction of the common-base-cascode-transistor Q2 to the cascode pull-down. This leaky reverse base-emitter junction may occur with high-fT NPN HBTs that are used with relatively low reverse breakdown voltages, for example approximately 1.5V at 1 uA leakage for the base-emitter junction.

Case 4 has a direct leakage current path 262 from supply to ground via the resistors Rce2 and Rce1. Since case 4 requires two stacking faults in transistors that are electrically connected to each other, it is much less likely to occur compared to case 3 which only requires 1 stacking fault in any CB transistor. As stacking faults scale first order with emitter area, large transistors are more likely to have a stacking fault compared to small transistors. Consequently, with respect to case 4 if there is a power stage where both common-emitter-transistor Q1 and CB transistor Q2 are large, this increases the likelihood of stacking faults in both transistors. In practice, however, the probability of this case 4 occurring may be reduced by a layout of the devices which splits large transistors in parallel power stages, called power cells. Hence, the most likely scenarios are case 2 or case 3.

Referring now to RF amplifier 200, if the stacking fault illustrated in case 3 occurs, any leakage current originating from the cascode stacking fault has to flow through this high resistance Rpd creating enough voltage drop such that the leakage path is effectively blocked. This is because if the base voltage of the cascode transistor Q2 is close to VCC there can be no reverse-biased base-emitter junction and consequently no leakage current. A typical resistance value may be a few times VCC divided by the leakage criterion. For example for a typical 1 uA leakage criterion, a supply voltage Vcc of 2.5 volts, and a 4 times margin results in a value of 10 MΩ for Rpd. Furthermore since there is still a path to ground even though it is a high-ohmic path, the RF power amplifier will still avoid increased leakage current in case 2 as well, since in this case the base of the cascode transistor will be at ground and so the CB transistor Q2 will be turned off.

In this way, the RF power amplifier 200 when implemented for example in SiGe HBT technology may have a reduced leakage current in the presence of stacking faults. This may improve the product yield since RF amplifier 200 may still have acceptable leakage current even when a stacking fault is present.

Figure 7:
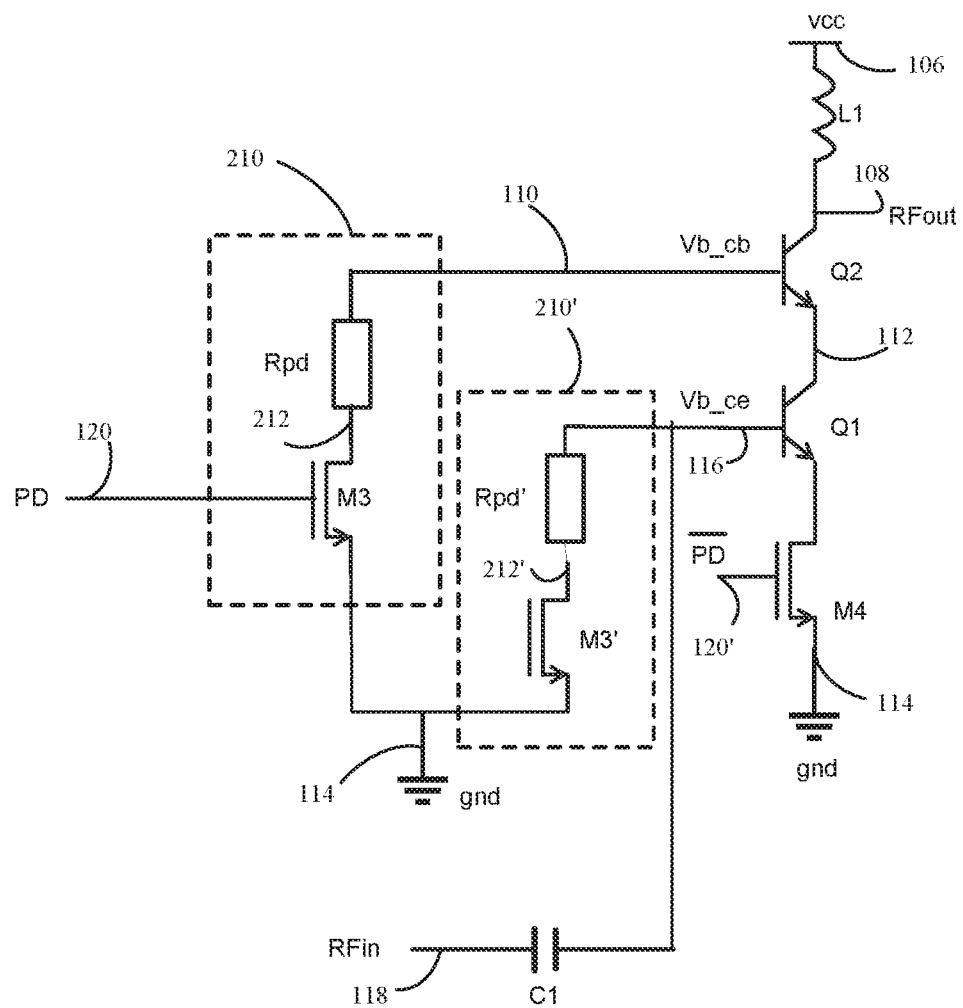
FIG. 7 illustrates a RF amplifier according to an embodiment.

FIG. 7 shows an RF amplifier 300. RF amplifier 300 is similar to RF amplifier 200. The differences are firstly that there is an additional NMOS transistor M4 having a first terminal coupled to the emitter of Q1 and a second terminal coupled to the second supply rail 114. The gate of the NMOS is coupled to inverse power down control input 120' which is driven by the inverse of the power down control signal pd. Secondly, the common emitter bias circuit 104 is replaced with a common emitter bias circuit 210' having a resistance Rpd' in series with MOS transistor M3' similar to the common base bias circuit 210. In other examples, alternative power down circuits providing a high-ohmic path to a second supply rail may be used.

In normal operation, NMOS transistor M4 is switched on and provides a low-ohmic path between the emitter of Q1 and the second supply rail 114. The normal operation of RF amplifier 300 is otherwise similar to RF amplifiers 100, 200. In power down mode, in addition to the high ohmic path from the base of the CB transistor Q2 via resistance Rpd and M3, the NMOS transistor M4 is switched off which disconnects the emitter of Q1. Common emitter bias circuit 210' provides a high-ohmic path from the base of common emitter transistor Q1 via the resistance Rpd' and MOS transistor M3' to the second supply rail 114. Referring back to FIG. 6, disconnecting the emitter may prevent the leakage path from Vcc to ground if stacking faults are present in both common-base-cascode-transistor Q2 and common emitter transistor Q1 as shown in equivalent circuit 260 for case 4. RF power amplifier 300 may also reduce leakage current in case 2 and case 3 as explained for RF power amplifier 200.

Furthermore, in case 4, when both common-emitter transistor Q and common-base-cascode-transistor Q2 have a stacking fault, when NMOS transistor M4 is switched off, the emitter of common emitter transistor Q1 is high-ohmic, so its voltage will start rising until its reverse base-emitter junction starts conducting. Including the high-ohmic resistance Rpd' in series with M3 may prevent a reverse bias of the base-emitter junction, since the voltage at the base of the common-emitter transistor Q1 will also increase. Consequently the leakage path to the second supply rail 114 via the base-emitter junction of the common-emitter transistor Q1 may be blocked.

RF amplifier 200 and RF amplifier 300 implement a high resistance path to ground using a resistor Rpd. Implementing a resistance with a high value may require a large implementation area. For example for a multi-channel 5G frontend IC with 8 channels on one IC, each with a transmitter and receiver having 5 stages to achieve sufficient gain at millimetre wave frequencies, requires eighty cascode bias circuits and consequently eighty resistors of 10 MΩ.

Figure 8:
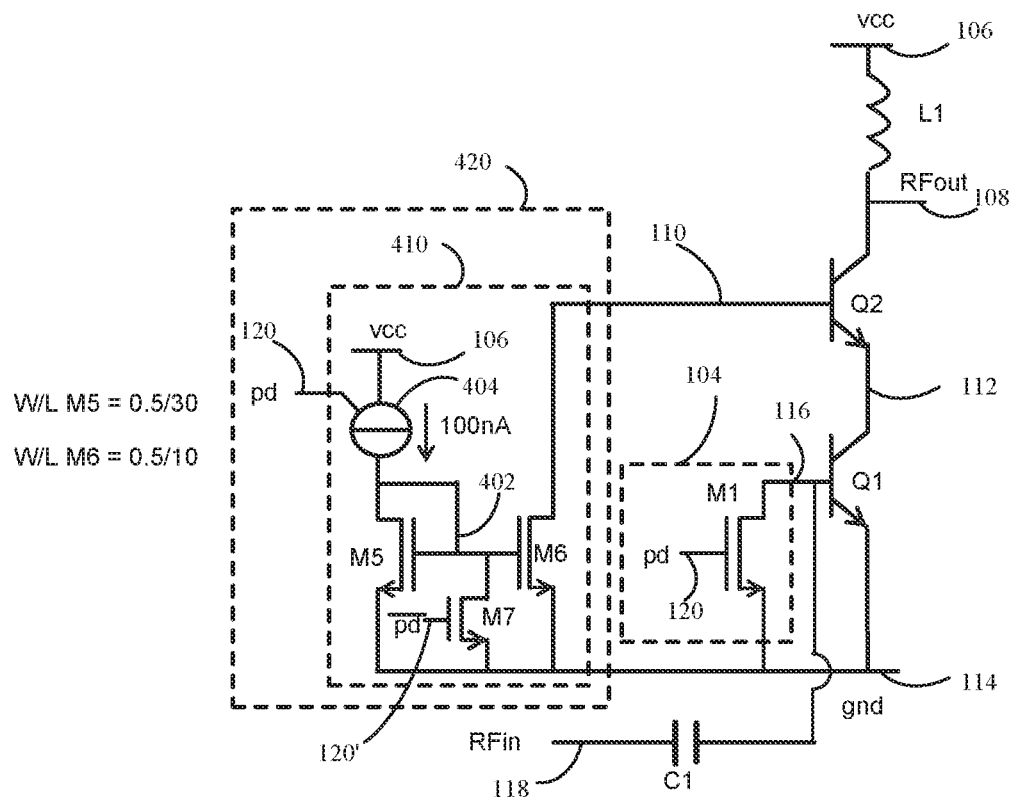
FIG. 8 illustrates a RF amplifier according to an embodiment.

This is addressed by the RF amplifier 400 illustrated in FIG. 8. RF amplifier 400 includes a cascode stage of a common-emitter-transistor Q1, a common-base-cascode-transistor Q2, together with an inductor L1, a DC coupling capacitor C1 and common emitter bias circuit 104 as previously described for RF amplifiers 100, 200, 300. RF amplifier 400 further includes a common base bias circuit 420 which has a power down circuit 410.

The power down circuit 410 includes a current mirror arrangement of NMOS transistors M5 and M6, a current source 404 and further NMOS transistor M7. The current source 404 has a first terminal connected to first supply rail 106 and a second terminal connected to node 402. Node 402 may be connected to the gates of NMOS transistors M5 and M6, a first terminal of NMOS transistor M7 and a first terminal of M5. A second terminal of M5, a second terminal of M6 and a second terminal of M7 may be connected to a second supply rail 114. The current source 404 may have a control input connected to the power down control. The gate of the NMOS transistor M7 maybe connected to the inverse power down control input 120'.

The normal operation of the RF amplifier 400 is similar to that of RF amplifiers 100, 200 and 300. In normal operation the current source 404 is switched off and the NMOS transistor M7 is switched on and so the gates of the NMOS transistors M5 and M6 are coupled to the second supply rail 114 which may be a ground. In power down mode, the current source 404 is switched on and transistor M7 is switched off.

In power down mode operation, the NMOS transistor M6 provides a high-ohmic path to the second supply rail 114 from the base of the common-base-cascode-transistor Q2. The relative width to length ratios of the transistors M5 and M6 of the current mirror may be chosen to determine the maximum allowed current through M6 from the base of common-base-cascode-transistor Q2 to the second supply rail 114. This maximum allowed current may be chosen as a fraction of the leakage criterion. For example if 300 nA is chosen as a fraction of the leakage criterion of 1 uA, then up to three stacking faults can be allowed. If the current source 404 provides a current of 100 nA, then for a 300 nA current through M6 the W/L ratio of M6 must be three times that of M5.

The NMOS transistor M6 has two regimes of operation:
1. linear region: the NMOST M6 will operate in this regime when there is no stacking fault in the cascode transistor; it functions as a pull-down to ground, even with a desirable relatively low impedance of a few 100 kΩ.
2. saturation region: the NMOST M6 operates as a current source and limits the effect of a stacking fault in the cascode transistor to 300 nA supply leakage; its output impedance in this regime can easily be several 100 MΩ.

In some examples a single input mirror path via current source 404 and NMOS transistor M5 may be used, with multiple output mirror transistors arranged in parallel with NMOS transistor M6 for multiple cascode transistor bias circuits.

Figure 9:
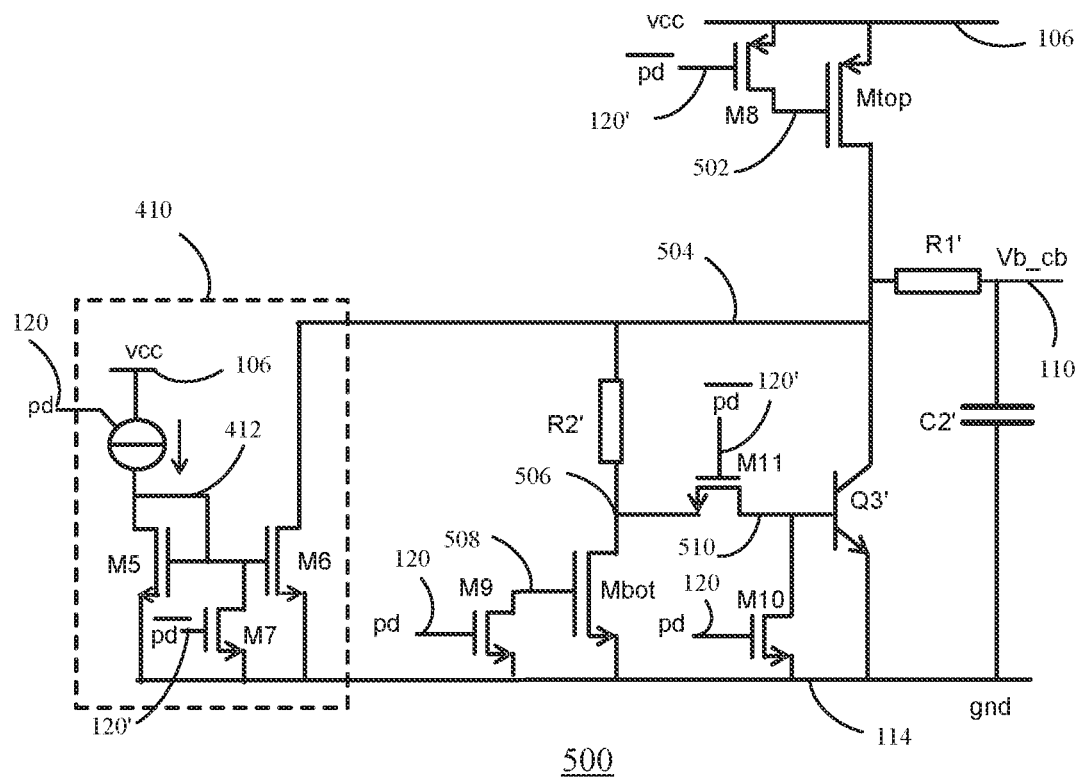
FIG. 9 illustrates a bias circuit for a common-base-cascode-transistor in a RF amplifier according to an embodiment.

FIG. 9 shows a common base bias circuit 500 which may be used to bias a common-base-cascode-transistor such as common-base-cascode-transistor Q2 in RF amplifiers 200, 300,400.

Common base bias circuit 500 includes power down circuit 410. It will be appreciated that in other examples power down circuits used in common base bias circuits 210 and 420 may be used instead. The remainder of the circuitry shown is used to bias a common-base-cascode-transistor in an RF amplifier in normal operation mode.

Node 502 is connected to a gate of PMOS transistor Mtop and a drain of PMOS transistor M8. First supply rail 106 is connected to a source of PMOS transistor Mtop and PMOS transistor M8.

Node 504 is connected to a first terminal of first resistor R1' and a first terminal of second resistor R2' and the collector of NPN transistor Q3'.

Node 506 is connected to a second terminal of second resistor R2', a source of NMOS transistor M11 and the drain of NMOS transistor Mbot.

Node 508 is connected to a gate of NMOS transistor Mbot and the drain of NMOS transistors M9.

Second supply rail 114 is connected to the source of NMOS transistors M9, Mbot, M10, the emitter of NPN transistor Q3' and a first terminal of capacitor C2'

Node 510 is connected to the drain of NMOS transistor M1, the drain of NMOS transistor M10 and the base of NPN bipolar transistor Q3'.

The output 110 of the common base bias circuit is connected to a second terminal of capacitor C2 and a second terminal of resistor R1'.

Power down control input 120 is connected to the gates of NMOS transistors M9, M10. The inverse power down control input 120' is connected to the gates of MOS transistors M8 and M11.

The circuit 500 in normal mode is configured similarly to common base bias circuit 150 and the power down circuit 410 is disabled. Itop and Ibot current sources are now represented by transistors Mtop and Mbot. These are turned off by MOS transistor switches M8, M9 at their gates driven by power down signals pd and pd_bar which is the inverse of the power down signal pd. Powerdown is active when pd=vcc. Note that transistor Q3' needs to be turned off by the two NMOS switches M10 and M11 at the base of transistor Q3'. This is only necessary to maintain a high impedance at the Vcasc node for all voltages between gnd and vcc. Without these 2 extra switches transistor Q3 will act as a ground-connected diode preventing a high impedance for Vcasc voltages say >0.4V. M6 provides the current source which is on during powerdown, and off during normal operation.

Figure 10:
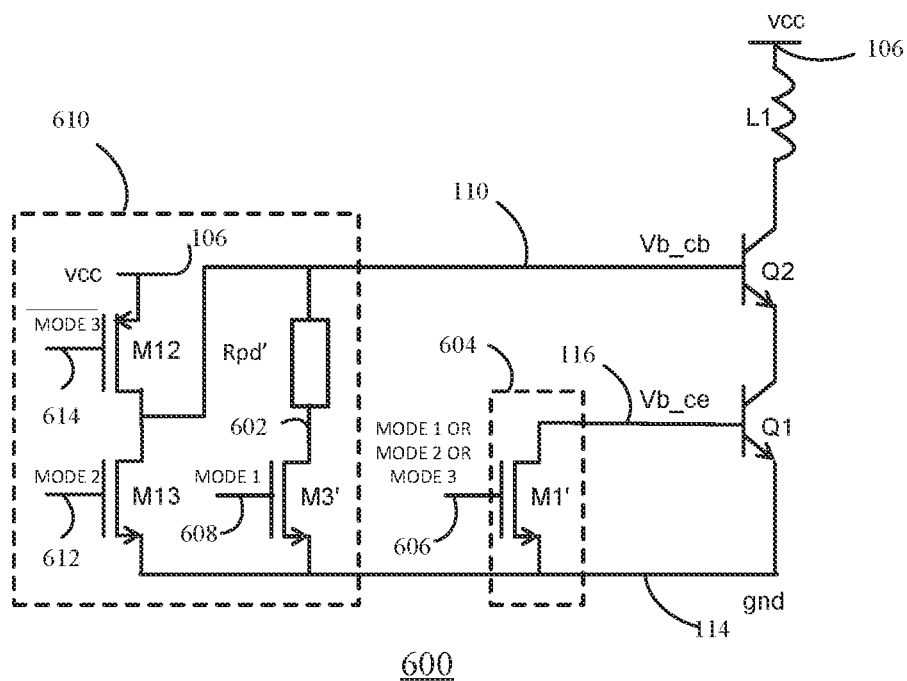
FIG. 10 illustrates a RF amplifier according to an embodiment.

FIG. 10 shows an RF amplifier circuit 600 with multiple non-operational modes. A CE bias circuit 604 includes a CE power down NMOS transistor M1' having a first terminal connected to the common emitter bias circuit output 116, a second terminal connected to the second supply rail 114 and a gate terminal connected to a first mode control input 606. The CB bias circuit 610 includes a common-base-test-mode NMOS transistor M13 having a first terminal connected to the common base bias circuit output 110, a second terminal connected to the second supply rail 114 and a gate terminal connected to a second mode control input 612. The CB bias circuit 610 includes a common-emitter-test-mode PMOS transistor M12 having a first terminal connected to the common base bias circuit output 110, a second terminal connected to the first supply rail 106 and a gate terminal connected to a third mode control input 614.

The CB bias circuit 610 includes a CB power down NMOS transistor M3' having a first terminal connected to node 602, a second terminal connected to the second supply rail 114 and a gate terminal connected to a fourth mode control input 608. The CB bias circuit 610 includes a resistor Rpd' having a first terminal connected to node 602 and a second terminal connected to the common base bias circuit output 110.

In operation the first mode control input 606, second mode control input 612, third mode control input 614 and fourth mode control input 608 may be connected to a controller (not shown). The RF power amplifier circuit 600 in additional to the normal operation modes, have the following modes.

Mode 1 is the mode previously described which provides a high impedance path to the second supply rail. As illustrated this is provided by resistor Rpd which may have a resistance greater than 100 KΩ but may also use a current source such as current source 410. This is the low-leakage mode where both CE transistor Q1 and CB transistor Q2 stacking faults are not visible in VCC leakage measurements Mode 2 is the low-ohmic pull-down mode in which the CE transistor Q1 stacking faults are not visible, but the CB transistor Q2 stacking faults are visible in VCC leakage measurements. Mode 2 may be referred to as the common-base test mode.

Mode 3 biases the CB cascode transistor Q2 in active mode, for example by forcing the cascode base voltage to VCC. In mode 3, the CB cascode transistor Q2 stacking faults are not visible, but the CE transistor Q1 stacking faults are visible in VCC leakage measurements. Mode 3 may be referred to as the common-emitter test mode.

Table 2 below shows the status of the transistors M1', M3' M13, M12 in the different operation modes.

TABLE 2

|  | Normal | Mode 1 | Mode 2 | Mode 3 |
| --- | --- | --- | --- | --- |
| M1' | off | on | on | on |
| M3' | off | on | off | off |
| M13 | off | off | on | off |
| M12 | off | off | off | on |

The RF amplifier 600 may be configured in mode 2 and/or mode 3 during production test for screening out extreme stacking faults which may degrade product performance. Using mode 1 during power down mode may allow the RF amplifier to have acceptable leakage current even in the presence of less severe stacking faults. Consequently the RF amplifier 600 may result in an optimized yield for the required performance.

Embodiments of the RF amplifier described may allow the presence of stacking faults while maintaining acceptable leakage current levels. Embodiments of the RF amplifier may also maintain acceptable leakage current levels for any other physical mechanism resulting in an unintended resistive path from collector to emitter, or from collector to base.

The cascode stages are shown with a single cascode transistor Q2. In other examples, the cascode stage may use differential pairs as cascodes on top of common-emitter-transistors, like Gilbert cells used in mixers, variable gain amplifiers (VGA's) and Vector Modulators. The cascode stages illustrated and described use NPN bipolar transistors. However, it will be appreciated that other examples may use PNP transistors or a combination of NPN and PNP transistors.

An RF amplifier for implementation in SiGe HBT technology is described. The RF amplifier has a cascode stage comprising a common base (CB) transistor and a common emitter (CE) transistor arranged in series between a first voltage rail and a second voltage rail. An RF input is coupled to the base of the CE transistor and an RF output is coupled to the collector of the CB transistor. The RF amplifier includes a CB power-down circuit arranged between the base of the CB transistor and the second voltage rail and a CE power-down circuit arranged between the base of the CE transistor and the second voltage rail. In a power-down mode the CE power-down circuit couples the base of the common emitter transistor to the second voltage rail. The CB power-down mode circuit couples the base of the CB transistor to the second voltage rail via a high-ohmic path.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. A radio-frequency, RF, amplifier for implementation in Silicon-Germanium, SiGe, hetero-junction-bipolar transistor, HBT, technology, the RF amplifier comprising:
   a cascode stage comprising a common-base-cascode-transistor and a common-emitter-transistor arranged in series between a first voltage rail and a second voltage rail;
   an RF input coupled to the base of the common-emitter-transistor;
   an RF output coupled to the collector of the common-base-cascode-transistor;
   a common-base bias circuit coupled to the base of the common-base-cascode-transistor and comprising a common-base-power-down circuit arranged between the base of the common-base-cascode-transistor and the second voltage rail;
   a common-emitter bias circuit coupled to the base of the common-emitter-transistor comprising a common-emitter-power-down circuit arranged between the base of the common-emitter-transistor and the second voltage rail; and
   wherein in a power-down mode of operation, the common-emitter power-down circuit is configured to couple the base of the common-emitter-transistor to the second voltage rail and the common-base-power-down circuit is configured to couple the base of the common-base transistor to the second voltage rail via a high-ohmic path;

wherein in a power-down mode of operation, the common-emitter power-down circuit is configured to couple the base of the common-emitter-transistor to the second voltage rail via a low-ohmic path wherein the low-ohmic path impedance is less than the high-ohmic path impedance.

2. The RF amplifier of claim 1 wherein in the power-down mode, the base-emitter junction of the common-base-cascode-transistor is not reverse-biased.

3. The RF amplifier of claim 1 wherein the first voltage rail is a voltage supply rail and the second voltage rail is a ground rail.

4. The RF amplifier of claim 1 wherein the impedance of the high-ohmic path is greater than 100 KOhm.

5. A radio-frequency, RF, amplifier for implementation in Silicon-Germanium, SiGe, hetero-junction-bipolar transistor, HBT, technology, the RF amplifier comprising:
a cascode stage comprising a common-base-cascode-transistor and a common-emitter-transistor arranged in series between a first voltage rail and a second voltage rail;
an RF input coupled to the base of the common-emitter-transistor;
an RF output coupled to the collector of the common-base-cascode-transistor;
a common-base bias circuit coupled to the base of the common-base-cascode-transistor and comprising a common-base-power-down circuit arranged between the base of the common-base-cascode-transistor and the second voltage rail;
a common-emitter bias circuit coupled to the base of the common-emitter-transistor comprising a common-emitter-power-down circuit arranged between the base of the common-emitter-transistor and the second voltage rail;
wherein in a power-down mode of operation, the common-emitter power-down circuit is configured to couple the base of the common-emitter-transistor to the second voltage rail and the common-base-power-down circuit is configured to couple the base of the common-base transistor to the second voltage rail via a high-ohmic path;
wherein the common-base power-down circuit comprises a current mirror, and wherein a first transistor of the current mirror is coupled to a reference current source and a second transistor of the current mirror is arranged between the base of the common-base-cascode-transistor and the second supply terminal, and wherein the current mirror is configured to limit the current between the base of the common-base-cascode-transistor and the second supply terminal in the power down mode.

6. The RF amplifier of claim 5 wherein the current limit is determined by the relative width to length ratios of the first MOS transistor channel and the second MOS transistor channel.

7. The RF amplifier of claim 5 further comprising a second cascode stage having a second common-emitter-transistor and second common-base-cascode-transistor, wherein the current mirror further comprises a third transistor arranged between the base of the second common-base-cascode-transistor and the second supply terminal, and wherein the current mirror is further configured to limit the current between the base of the second common-base-cascode-transistor and the second supply terminal in the power down mode.

8. A radio-frequency, RF, amplifier for implementation in Silicon-Germanium, SiGe, hetero-junction-bipolar transistor, HBT, technology, the RF amplifier comprising:
a cascode stage comprising a common-base-cascode-transistor and a common-emitter-transistor arranged in series between a first voltage rail and a second voltage rail;
an RF input coupled to the base of the common-emitter-transistor;
an RF output coupled to the collector of the common-base-cascode-transistor;
a common-base bias circuit coupled to the base of the common-base-cascode-transistor and comprising a common-base-power-down circuit arranged between the base of the common-base-cascode-transistor and the second voltage rail;
a common-emitter bias circuit coupled to the base of the common-emitter-transistor comprising a common-emitter-power-down circuit arranged between the base of the common-emitter-transistor and the second voltage rail;
wherein in a power-down mode of operation, the common-emitter power-down circuit is configured to couple the base of the common-emitter-transistor to the second voltage rail and the common-base-power-down circuit is configured to couple the base of the common-base transistor to the second voltage rail via a high-ohmic path;
wherein the common-base bias circuit further comprises a common-base-test-mode control transistor coupled between the base of the common-base-cascode-transistor and the second supply rail, and wherein in a common-base-test-mode, the common-base bias circuit is further configured to couple the base of the common-base-cascode-transistor to the second supply rail via a low-ohmic path, and the common-emitter-power-down circuit is further configured to couple the base of the common-emitter-transistor to the second supply rail via a low-ohmic path.

9. A radio-frequency, RF, amplifier for implementation in Silicon-Germanium, SiGe, hetero-junction-bipolar transistor, HBT, technology, the RF amplifier comprising:
a cascode stage comprising a common-base-cascode-transistor and a common-emitter-transistor arranged in series between a first voltage rail and a second voltage rail;
an RF input coupled to the base of the common-emitter-transistor;
an RF output coupled to the collector of the common-base-cascode-transistor;
a common-base bias circuit coupled to the base of the common-base-cascode-transistor and comprising a common-base-power-down circuit arranged between the base of the common-base-cascode-transistor and the second voltage rail;
a common-emitter bias circuit coupled to the base of the common-emitter-transistor comprising a common-emitter-power-down circuit arranged between the base of the common-emitter-transistor and the second voltage rail;
wherein in a power-down mode of operation, the common-emitter power-down circuit is configured to couple the base of the common-emitter-transistor to the second voltage rail and the common-base-power-down circuit is configured to couple the base of the common-base transistor to the second voltage rail via a high-ohmic path;

wherein the common-base bias circuit further comprises a common-emitter-test mode control transistor coupled between the base of the common-base-cascode-transistor and the first supply rail; and wherein in a common-emitter-test-mode the common-base bias circuit is further configured to couple the base of the common-base-cascode-transistor to the first supply rail via a low-ohmic path, and the common-emitter-power-down circuit is further configured to couple the base of the common-emitter-transistor to the second supply rail via a low-ohmic path.

10. A radio-frequency, RF, amplifier for implementation in Silicon-Germanium, SiGe, hetero-junction-bipolar transistor, HBT, technology, the RF amplifier comprising:
a cascode stage comprising a common-base-cascode-transistor and a common-emitter-transistor arranged in series between a first voltage rail and a second voltage rail;
an RF input coupled to the base of the common-emitter-transistor;
an RF output coupled to the collector of the common-base-cascode-transistor;
a common-base bias circuit coupled to the base of the common-base-cascode-transistor and comprising a common-base-power-down circuit arranged between the base of the common-base-cascode-transistor and the second voltage rail;
a common-emitter bias circuit coupled to the base of the common-emitter-transistor comprising a common-emitter-power-down circuit arranged between the base of the common-emitter-transistor and the second voltage rail;
wherein in a power-down mode of operation, the common-emitter power-down circuit is configured to couple the base of the common-emitter-transistor to the second voltage rail and the common-base-power-down circuit is configured to couple the base of the common-base transistor to the second voltage rail via a high-ohmic path;
an emitter isolation switch arranged between the emitter of the common-emitter-transistor and the second supply terminal and having a control input configured to receive a power down control signal, wherein in the power down mode of operation, the emitter isolation switch is configured to decouple the emitter of the common-emitter-transistor from the second supply rail.

11. The RF amplifier of claim 10 wherein in the power down mode, the common-emitter power down circuit is configured to couple the base of the common-emitter transistor to the second supply rail via a high-ohmic path.

12. The RF amplifier of claim 10 wherein in a power-down mode of operation, the common-emitter power-down circuit is configured to couple the base of the common-emitter-transistor to the second voltage rail via a low-ohmic path wherein the low-ohmic path impedance is less than the high-ohmic path impedance.

13. The RF amplifier of claim 1 wherein the impedance of the low-ohmic path is less than 2 KOhm.

14. A mobile device comprising the RF amplifier of claim 1.

15. A mobile cellular base-station comprising the RF amplifier of claim 1.

16. The RF amplifier of claim 10 wherein in the power-down mode, the base-emitter junction of the common-base-cascode-transistor is not reverse-biased.

17. The RF amplifier of claim 10 wherein the first voltage rail is a voltage supply rail and the second voltage rail is a ground rail.

18. The RF amplifier of claim 10 wherein the impedance of the high-ohmic path is greater than 100 KOhm.

19. The RF amplifier of claim 10, wherein the common-base power-down circuit comprises a current mirror, and wherein a first transistor of the current mirror is coupled to a reference current source and a second transistor of the current mirror is arranged between the base of the common-base-cascode-transistor and the second supply terminal, and wherein the current mirror is configured to limit the current between the base of the common-base-cascode-transistor and the second supply terminal in the power down mode.

20. The RF amplifier of claim 10 wherein the common-base bias circuit further comprises a common-emitter-test mode control transistor coupled between the base of the common-base-cascode-transistor and the first supply rail; and wherein in a common-emitter-test-mode the common-base bias circuit is further configured to couple the base of the common-base-cascode-transistor to the first supply rail via a low-ohmic path, and the common-emitter-power-down circuit is further configured to couple the base of the common-emitter-transistor to the second supply rail via a low-ohmic path.

* * * * *